United States Patent
Chang et al.

(10) Patent No.: US 6,880,135 B2
(45) Date of Patent: Apr. 12, 2005

(54) METHOD OF INCORPORATING LENS ABERRATION INFORMATION INTO VARIOUS PROCESS FLOWS

(75) Inventors: Fang-Cheng Chang, Sunnyvale, CA (US); Christophe Pierrat, Santa Clara, CA (US); J. Tracy Weed, San Jose, CA (US)

(73) Assignee: Synopsys, Inc., Mountain View, CA (US)

( * ) Notice: Subject to any disclaimer, the term of this patent is extended or adjusted under 35 U.S.C. 154(b) by 707 days.

(21) Appl. No.: 10/005,615

(22) Filed: Nov. 7, 2001

(65) Prior Publication Data

US 2003/0088847 A1 May 8, 2003

(51) Int. Cl.[7] .............................................. G06F 17/50
(52) U.S. Cl. .................................. 716/4; 716/1; 716/19; 716/21; 700/121
(58) Field of Search ........................... 716/1, 4, 19, 21; 703/13–14; 700/121

(56) References Cited

U.S. PATENT DOCUMENTS

| | | | | |
|---|---|---|---|---|
| 5,586,059 | A | * 12/1996 | Oshelski et al. | 702/84 |
| 5,631,110 | A | 5/1997 | Shioiri et al. | 430/5 |
| 5,682,323 | A | 10/1997 | Pasch et al. | 364/491 |
| 5,723,233 | A | 3/1998 | Garza et al. | 430/5 |
| 5,757,673 | A | * 5/1998 | Osheiski et al. | 702/182 |
| 5,801,954 | A | 9/1998 | Le et al. | 364/488 |
| 5,815,685 | A | 9/1998 | Kamon | 395/500 |
| 5,825,647 | A | 10/1998 | Tsudaka | 364/167.03 |
| 5,991,006 | A | 11/1999 | Tsudaka | 355/53 |
| 6,014,456 | A | 1/2000 | Tsudaka | 382/144 |
| 6,049,789 | A | 4/2000 | Frison et al. | 705/59 |
| 6,081,658 | A | 6/2000 | Rieger et al. | 395/500.22 |
| 6,081,659 | A | 6/2000 | Garza et al. | 395/500.22 |
| 6,154,563 | A | 11/2000 | Tsudaka | 382/144 |
| 6,243,855 | B1 | 6/2001 | Kobayashi et al. | 716/19 |
| 6,249,597 | B1 | 6/2001 | Tsudaka | 382/144 |
| 6,289,499 | B1 | 9/2001 | Rieger et al. | 716/21 |
| 6,298,473 | B1 | 10/2001 | Ono et al. | 716/21 |
| 6,338,922 | B1 | 1/2002 | Liebmann et al. | 430/5 |
| 6,453,457 | B1 | 9/2002 | Pierrat et al. | 716/19 |
| 6,578,188 | B1 | * 6/2003 | Pang et al. | 716/19 |
| 2002/0100004 | A1 | 7/2002 | Pierrat et al. | 716/5 |

FOREIGN PATENT DOCUMENTS

| | | |
|---|---|---|
| GB | 2324169 A | 10/1998 |
| JP | 3-80525 | 4/1991 |
| WO | WO 99/14638 A1 | 3/1999 |
| WO | WO 00/67074 A1 | 11/2000 |
| WO | WO 00/67075 A1 | 11/2000 |
| WO | WO 00/67076 A1 | 11/2000 |

OTHER PUBLICATIONS

Kirk, J., "Measurement of Astigmatishm in Microlithography Lenses", IBM Microelectronics (7 pages).

Cobb, N., et al., "Fast, Low–Complexity Mask Design", SPIE, vol. 2440, pp. 313–327, Feb. 22–24, 1995.

Flagello, D., et al., "Towards a Comprehensive Control of Full–Field Image Quality in Optical Photolithography", SPIE, pp. 1–14, Mar. 1997.

(Continued)

Primary Examiner—Leigh M. Garbowski
(74) Attorney, Agent, or Firm—Bever, Hoffman & Harms LLP; Jeanette S. Harms

(57) ABSTRACT

A method of evaluating a stepper process affected by lens aberration is provided. The method includes receiving, from a facilitator responding to a request, a set of optical models including lens aberration information, wherein the lens aberration information is difficult to extract from the optical models. A decision can be made using the set of optical models. The decision could include determining which stepper(s) can be used (or should be avoided) with a mask, a layout, a process, and/or a chemistry. The decision could include ranking a plurality of steppers based on mask data to determine the best stepper (or next best steppers) to use.

44 Claims, 10 Drawing Sheets

OTHER PUBLICATIONS

Cobb, N., et al., "Experimental Results on Optical Proximity Correction With Variable Threshold Resist Model", SPIE, vol. 3051, pp. 458–468, Mar. 12–14, 1997.

Cobb, N., "Fast Optical and Process Proximity Correction Algorithms for Integrated Circuit Manufacturing", Dissertation, University of California at Berkeley, UMI Microform 9902038 (139 pages).

Toublan, O., et al., "Phase Aware Proximity Correction for Advanced Masks", SPIE, vol. 4000, pp. 160–170, Mar. 1–3, 2000.

Anonymous, "Parameterization For Full Shape And Rule Dependent DIssection", IPCOM000009587D, Sep. 4, 2002 (9 pages).

Ackmann, P., et al., "Phase Shifting and Optical Proximity Corrections to Improve CD Control on Logic Devices in Manufacturing for Sub 0.35 µm I–Line", SPIE, vol. 3051, pp. 146–153, Mar. 12–14, 1997.

Lithas, "Lithas: Optical Proximity Correction Software" (2 pages).

Precim, "Proxima System", Precim Company, Portland, Oregon (2 pages).

Precim, "Proxima Wafer Proximity Correction System", Precim Company, Portland, Oregon (2 pages).

Rieger, M., et al., "Mask Fabrication Rules for Proximity–Corrected Patterns", Precim Company, Portland, Oregon (10 pages).

Rieger, M., et al., "Using Behavior Modeling for Proximity Correction", Precim Company, Portland, Oregon (6 pages).

Cobb, et al., "Fast Sparse Aerial Image Calculation for OPC", SPIE, vol. 2621, pp. 534–544, Sep. 20–22, 1995.

Cai, L., et al., "Enhanced Dispositioning of Reticle Defects Using the Virtual Stepper with Automated Defect Severity Scoring", Numerical Technologies, Inc., Advanced Micro Devices, Inc., pp. 1–12.

Lucas, K., et al., "Model Based OPC for 1st Generation 193nm Lithography", Motorola Inc., IDT assignee to IMEC (12 pages).

Stimiman, J., et al., "Quantifying Proximity and Related Effects in Advanced Wafer Processes", Precim Company, Hewlett Packard Labs (9 pages).

Sugawara, M., et al., "Practical Evaluation of Optical Proximity Effect Corcection by EDM Methodology", Sony Corporation (11 pages).

Ronse, K., et al., "Thin Film Interference Effects in Phase Shifting Masks Causing Phase and Transmittance Errors", IMEC (15 pages).

Neureuther, A., et al., "Modeling Defect–Feature Interactions in the Presence of Aberrations", University of California Berkeley (10 pages).

Casey, Jr., et al., "Chemically Enhanced FIB Repair of Opaque Defects on Molybdenum Silicide Photomasks", SPIE, vol. 3236, pp. 487–497 (1997).

Yeung, M., "Measurement of Wave–Front Aberrations in High–Resolution Optical Lithographic Systems From Printed Photoresist Patterns", Boston University, pp. 1–27.

Salch, B., et al., "Reduction of Errors of Microphotographic Reproductions by Optimal Corrections of Original Masks", Optical Engineering, vol. 20, No. 5, pp. 781–784, Sep./Oct. 1981.

Henke, W., et al., "A Study of Reticle Defects Imaged Into Three–Dimensional Developed Profiles of Positive Photoresist Using the Solid Lithography Simulator", Microelectronics Eng., vol. 14, pp. 283–297 (1991).

Fu, C.C., et al., "Enhancement of Lithographic Patterns by Using Serif Features", IEEE, Transactions On Electron Devices, vol. 38, No. 12, pp. 2599–2603, Dec. 1991.

Ham, Y.M., et al., "Dependence of Defects in Optical Lithography", Jpn. J. Appl. Phys., vol. 31, pp. 4137–4142 (1992).

Watanabe, H., et al., "Detection and Printability of Shifter Defects in Phase–Shifting Masks II Defocus Characteristics", Jpn. J. Appl. Phys., vol. 31, pp. 4155–4160 (1992).

Harafuji, K., et al., "A Novel Hierarchical Approach for Proximity Effect Correction in Electron Beam Lithography", IEEE, vol. 12, No. 10, pp. 1508–1514, Oct. 1993.

Nistler, J., et al., "Phase Shift Mask Defect Printability Analysis", Proceedings Of The Microlithography Seminar INTERFACE '93, OCG Microelectronic Materials, Inc., pp. 11–28 (1993).

Rieger, M., et al., "System for Lithography Proximity Compensation", Precim Company, Portland, Oregon, Sep. 1993 (28 pages).

Yan, P., et al., "Effect Of Lens Aberration on Oblique Illumination Stepper System", SPIE, vol. 1927, pp. 167–180 (1993).

Spence, C., et al., "Automated Determination of CAD Layout Failures Through Focus: Experiment and Simulation", SPIE, vol. 2197, pp. 302–313 (1994).

Stirniman, J., et al., "Fast Proximity Correction with Zone Sampling", SPIE, vol. 2197, pp. 294–301 (1994).

Stirniman, J., et al., "Optimizing Proximity Correction for Wafer Fabrication Processes", SPIE, Photomask Technology And Management, vol. 2322, pp. 239–246 (1994).

Stirniman, J., et al., "Wafer Proximity Correction and Its Impact on Mask–Making", Bacus News, vol. 10, Issue 1, pp. 1, 3–7, 10–12, Jan. 1994.

Henderson, R., et al., "Optical Proximity Effect Correction: An Emerging Technology", Microlithography World, pp. 6–12 (1994).

Barouch, E., et al., "OPTIMASK: An OPC Algorithm for Chrome and Phase–Shift Mask Design", SPIE, Vo. 2440, pp. 192–206, Feb. 1995.

Karklin, L., "A Comprehensive Simulation Study of the Photomask Defects Printability", SPIE, vol. 2621, pp. 490–504 (1995).

Nagahiro, Y., "Improved Mask Technique for Photolithography Applied to 0.25µm LSI—Improvement of Resolution, Pattern Correction, Exposure Area", Nikkei Microdevices, pp. 1–6, Apr. 1995.

Yen, A., et al., "Characterization and Correction of Optical Proximity Effects in Deep–Ultraviolet Lithography Using Behavior Modeling", J. Vac. Sci. Technol. B. vol. 14, No. 6, pp. 4175–4178, Nov./Dec. 1996.

Gans, F., et al., "Printability and Repair Techniques for DUV Photomasks", SPIE, Proceedings Of The 17th Annual Symposium On Photomask Technology And Management, vol. 3236, pp. 136–141 (1997).

Ibsen, K., et al., "Clear Field Reticle Defect Diposition for Advanced Sub–Half Micron Lithography", SPIE, Proceedings Of The 17th Annual Symposium On Photomask Technology And Management, vol. 3236, pp. 124–135 (1997).

Morimoto, H., et al., "Next Generation Mask Strategy—Technologies are Ready for Mass Production of 256MDRAM?", SPIE, vol. 3236, pp. 188–189 (1997).

Park, C., et al., "An Automatic Gate CD Control for a Full Chip Scale SRAM Device", SPIE, vol. 3236, pp. 350–357 (1997).

Brunner, T., "Impact of Lens Aberrations on Optical Lithography", IBM J. Res. Develop., vol. 41, No. 1/2, pp. 57–67, Jan./Mar. 1997.

Dolainsky, C., et al., "Application of a Simple Resist Model to Fast Optical Proximity Correction", SPIE, vol. 3051, pp. 774–780 (1997).

Chuang, H., et al., "Practical Applications of 2–D Optical Proximity Corrections for Enhanced Performance of 0.25μm Random Logic Devices", IEEE, pp. 18.7.1–18.7.4, Dec. 1997.

Asai, N., et al., "Proposal for the Coma Aberration Dependent Overlay Error Compensation Technology", Jpn. J. Appl. Phys., vol. 37, pp. 6718–6722 (1998).

Gotoh, Y., et al., "Pattern Dependent Alignment Technique for Mix–and–Match Electron–Beam Lithography with Optical Lithography", J. Vac. Sci. Technol. B, vol. 16, No. 6. pp. 3202–3505, Nov./Dec. 1998.

Gordon, R., et al., "Design and Analysis of Manufacturing Alternating Phase–Shifting Masks", Bacus News, vol. 14, Issue 12, pp. 1–9, Dec. 1998.

Fukuda, H., et al., "Determination of High–Order Lens Aberration Using Phase/Amplitude Linear Algebra", J. Vac. Sci. Technol. B, vol. 17, No. 6, pp. 3318–3321, Nov./Dec. 1999.

Chen, et al., "ArF (193nm) Alternating PSM Quartz Defect Repair and Printability for 100nm Node", BACUS Photomask Technology, Sep. 21, 2001 (20 pages).

Sewell, H., et al., "Aberration Control for Advanced Step–and–Scan Systems Using Pupil Plane Engineering", Optical Microlithography XIV, Proceeding of SPIE, vol. 4346, pp. 585–594 (2001).

* cited by examiner

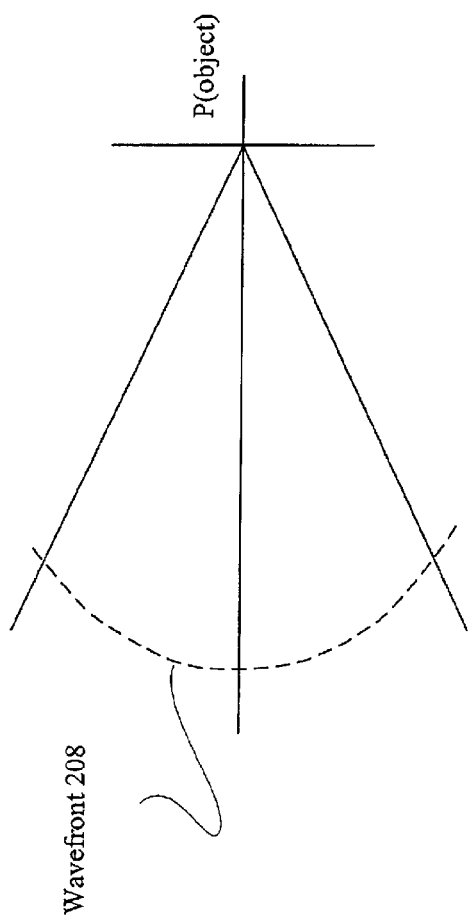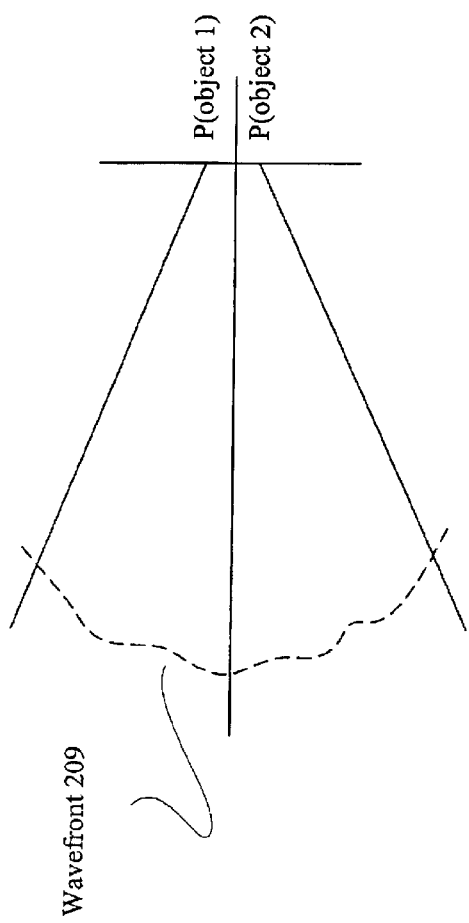

METHOD OF INCORPORATING LENS ABERRATION INFORMATION INTO VARIOUS PROCESS FLOWS

BACKGROUND OF THE INVENTION

1. Field of the Invention

The present invention relates to incorporating lens aberration information into various process flows and particularly to allowing stepper users to perform stepper and field aberration dependent simulations without direct access to the lens aberration information.

2. Description of the Related Art

To fabricate an integrated circuit (IC), a physical representation of the features of the IC, e.g. a layout, is transferred onto a plurality of masks. The features make up the individual components of the circuit, such as gate electrodes, field oxidation regions, diffusion regions, metal interconnections, and so on. A mask is generally created for each layer of the IC. A mask includes clear regions and opaque regions, wherein the pattern of these two regions defines the features of a particular semiconductor layer.

Typically, a mask includes patterns that can be transferred to the entire semiconductor substrate (for example, a wafer) in a single exposure. In contrast, a reticle must be stepped and repeated to expose the entire wafer. However, for ease of reference herein, the term "mask" refers to either a reticle or a mask.

To create a mask, the data representing the layout for a corresponding IC layer can be input, after fracturing, into an electron beam or optical exposure system, which writes a pattern for creating IC features using the data onto a mask (e.g. quartz substrate). Once a mask has been created, the pattern on the mask can be transferred onto the wafer surface using a lithographic process.

In one exemplary lithographic system, refractive optics can be used to transfer a pattern from a mask onto a portion of the total area of a wafer. (Note that in the case of certain next generation lithographic (NGL) systems, the optics may be reflective, e.g. extreme ultraviolet (EUV), 157 nm, etc.) In one embodiment, this smaller field size is approximately 1/50 the area of a 100 mm wafer. Because only a portion of the wafer can be written at one time, certain components of this lithographic system must be physically "stepped", or "scanned", across the wafer to expose other portions of the wafer. Lithographic systems that perform a stepping operation are called "steppers" and those that perform a combination stepping and scanning operation are called "scanners". The techniques described herein are equally applicable to steppers and scanners. The term "stepper" as used hereafter refers to both steppers and scanners.

FIG. 1 illustrates a stepper 100 including illumination optics 102 that direct radiation from an illumination source 101, such as a mercury lamp, to a mask 103. A projection lens 104 focuses the radiation emitted by mask 103 onto a portion of wafer 105, thereby transferring the mask feature (in this case, an "X") onto that portion. Although projection lens 104 is shown as a single component, multiple (e.g. 20–40) simple lens elements are actually mounted within a casing in an attempt to correct for optical aberrations.

In an ideal system, all rays emanating from a point in the object plane (i.e. mask 103) converge to one point in the image plane (i.e. wafer 105), thereby providing a clear image. FIG. 2A illustrates a simplified optical system 200 including two thin lens 201 and 202, positioned along an optical axis 207, that provide imaging of an on-axis object point P(object). Note that P(image) is the corresponding Gaussian image point for P(object). An aperture stop 203 limits the solid angle of the rays from P(object). An entrance pupil 205 is defined as the image of the aperture stop by surfaces between aperture stop 203 and P(object), whereas an exit pupil 204 is defined as the image of the aperture stop by surfaces between aperture stop 203 and P(image). A ray passing through the center of aperture stop 203, entrance pupil 205, and exit pupil 204 is called the chief ray. Rays other than the chief ray are called marginal rays.

If the rays from P(object) are followed through system 100 to exit pupil 204 such that each ray travels an optical distance equal to the chief ray, the surface passing through the rays' end points is called the system wavefront for P(object). If the wavefront is spherical, see wavefront 208 shown in FIG. 2B, then the Gaussian image is considered "perfect". On the other hand, if the wavefront includes deviations from the spherical form, see wavefront 209 shown in FIG. 2C, then the Gaussian image is considered to be aberrated. Note that the rays of aberrated wavefront 209 fail to converge and instead create two object points P(object1) and P(object2). An optical aberration can be any influence that causes rays from an image point to not converge as an object point in the image plane.

To account for aberrations in a system, an assumption can be made that the exit pupil is illuminated by a spherical wave, but that an imaginary phase-shifting plate exists within the aperture, thereby deforming the wavefront that leaves the aperture. If the phase error at a point (x,y) in the exit pupil is represented by kW(x,y), wherein k=2Π/λ and W is an effective path length error, then the complex transmittance P of the imaginary phase-shifting plate is equal to:

$$P(x,y)=P(x,y)\exp[jkW(x,y)]$$  Equation 1

W(x,y) can be reduced to a set of Zernike polynomials [$Z_i(v, \Phi)$] that describe the types of aberrations. For example, Zernike polynomials exist to describe defocus, x-astigmatism, y-astigmatism, x-coma, y-coma, three-leaf clover, and spherical aberrations.

This lens aberration information can be used as input data to various tools, thereby improving the accuracy of the tools' output data. Currently, to obtain this lens aberration information, the users must contact the stepper companies directly. However, stepper companies closely guard this information because it can disclose how the lenses of their steppers were optimized, i.e. balancing the various aberrations, which is considered a trade secret to the lens manufacturers (which are sometimes part of the stepper companies) and/or the stepper companies. Therefore, such information is rarely given, and even then typically only to users that have strategic relationships with the stepper companies.

Moreover, users now purchase a stepper based only on user-specified feature sizes. Users who understand that a particular type of aberration significantly impacts their specific patterns could use the lens aberration information as another criterion for stepper purchase. In other words, the lens aberration information could be a reason not to accept a particular stepper, e.g. tendered for delivery by the manufacturer. Thus, it is in the best interests of the stepper companies to provide the information to the stepper users in a controlled fashion.

Finally, this lens aberration information, even if provided by the stepper companies, is highly complex. For example, this aberration information can vary, not only from one type of stepper to another type of stepper, but even from one lens to another of the same model. Therefore, many users could have difficulty fully leveraging this information to their advantage.

Based on all of the above reasons, stepper companies would prefer to prevent all disclosure of lens aberration information. However, lens aberration can significantly affect the printing quality of sub-partial coherence features, particularly when trying to print features that are small compared to the wavelength of the exposure radiation $\lambda$. Specifically, lithography must be aggressive, e.g. indicated by a process-related parameter $k_1$ below 0.75, to print these small features. Note that the minimum resolution, or critical dimension, is given by the formula CD=k1 ($\lambda$/NA). Conventionally, for lithography using $k_1$ above 0.75, the effects from the aberration of the imaging system can either be ignored or represented as one set of polynomial coefficients across the entire field. In contrast, as feature sizes decrease, the variation of aberrations across the field may become too significant to ignore. If that occurs, then sub-fields indicating variations of the aberrations can be provided, wherein each sub-field can be defined by a different set of aberration coefficients.

Therefore, users are increasingly concerned regarding lens aberration and are requesting disclosure of this previously confidential information. Therefore, a need arises for a method of allowing users to perform stepper and field aberration dependent simulations without directly disclosing the lens aberration information, thereby fulfilling the needs of both the users and the stepper companies.

SUMMARY OF THE INVENTION

A method of evaluating a stepper process affected by lens aberration is provided. The method includes receiving, from a facilitator responding to a request, a set of optical models including lens aberration information, wherein the lens aberration information is difficult to extract from the optical models. An optical model can be defined as a representation of parameters for describing a lithographic process. More specifically, in some embodiments, the simulation process can be viewed as having two or more stages and the model can correspond to a representation of the input parameters necessary for simulation after processing by one or more stages of the simulation process.

A decision can be made using the set of optical models. The decision could include determining from a plurality of steppers a subset of the plurality of steppers suitable for reproducing a mask pattern within a predetermined amount of permitted critical parameter variance. Similar decisions could be made regarding a layout, a process, and/or related process chemistry. The decision could include ranking a plurality of steppers based on mask data to determine the best stepper (or next best steppers) to use. The decision could also include determining whether a mask is correctly made. In one embodiment, determining whether a mask is correctly made includes analyzing optical proximity correction (OPC) and/or defects on the mask. Finally, the decision could include determining whether the layout or OPC for a layout can be improved.

In accordance with one feature of the invention, the facilitator can generate the set of optical models for the users. To generate the set of optical models, the facilitator can receive Zernike polynomials, illumination non-uniformity parameters, and/or flare parameters, from at least one stepper company. In one embodiment, a user can request the optical models from the facilitator and the facilitator can provide the optical models directly to that user. In another embodiment, the stepper company can request the optical models on behalf of a user and, when received from the facilitator, can forward the optical models to that user.

In one embodiment, the method can further include simulating mask data using the optical models. In another embodiment, the method can further include calibrating the optical models using chemistry and/or process information. A test pattern can be simulated using the calibrated, or non-calibrated, optical models. Mask accuracy (including optical proximity correction (OPC)) can also be verified using the calibrated, or non-calibrated, optical models. If desired, a generic resist model can be used in conjunction with the optical results.

A mask used with a stepper is also provided. The stepper is selected based on a decision made by a user. To make this decision, the user can receive a set of optical models generated with lens aberration information, wherein the lens aberration information is difficult to extract from the optical models. These optical models are from a facilitator responding to a request. The user can use the set of optical models to make the decision.

An integrated circuit produced using a stepper is also provided. The stepper is selected based on a decision made by a user. To make this decision, the user can receive a set of optical models including lens aberration information, wherein the lens aberration information is difficult to extract from the optical models. These optical models are from a facilitator responding to a request. The user can use the set of optical models to make the decision.

A method of deciding to use a stepper with a particular mask is also provided. The method includes identifying a set of potential steppers for use with the mask and obtaining lens aberration information regarding each of the potential steppers. Based on the lens aberration information, a subset of the set of potential steppers suitable for reproducing a pattern of the particular mask within a predetermined amount of permitted critical parameter variance can be determined. In one embodiment, selecting the stepper can be done by ranking the subset of potential steppers based on critical parameter variance and choosing the stepper having least critical parameter variance. In another embodiment, selecting the stepper can be done by determining the scheduling of the subset of potential steppers and choosing the first available stepper. In yet another embodiment, selecting the stepper can be done by ranking the subset of potential steppers based on critical parameter variance, determining the scheduling of the subset of potential steppers, and choosing the stepper, available within a predetermined period of time, having least critical parameter variance.

A file used in selecting a stepper is also provided, wherein the stepper is intended for use with predetermined mask data. The file can include a set of optical models, wherein the optical models include lens aberration information specific to the stepper, and wherein the lens aberration information is virtually inextricable from the optical models.

A process to assist a second party in making a decision regarding the use of a stepper is also provided. The process includes a first party receiving lens aberration information for the stepper, generating optical models using the lens aberration information, and allowing the second party access to the optical models, but not the lens aberration information. A function that can be performed with the optical models by the second party provides an output that facilitates the decision made by the second party.

BRIEF DESCRIPTION OF THE DRAWINGS

FIG. 2B illustrates a spherical wavefront, thereby indicating that the Gaussian image is "perfect".

FIG. 2C illustrates a wavefront having deviations from the spherical form, thereby indicating that the Gaussian image is aberrated.

DETAILED DESCRIPTION OF THE DRAWINGS

In accordance with one feature of the invention, stepper users can make decisions based on lens aberration information incorporated into optical models. An optical model can be defined as a representation of parameters for describing a lithographic process. More specifically, in some embodiments, the simulation process can be viewed as having two or more stages and the model can correspond to a representation of the input parameters necessary for simulation after processing by one or more stages of the simulation process.

Advantageously, users cannot easily extract the lens aberration information provided in the optical models, thereby allowing the stepper companies to maintain the confidentiality of this information. Moreover, irrespective of the technical sophistication of the user, the user can fully realize the benefits of optical models by including lens aberration information during the model generation process. A facilitator can receive the lens aberration information from the stepper companies and generate the optical models, upon request.

Figure 1:
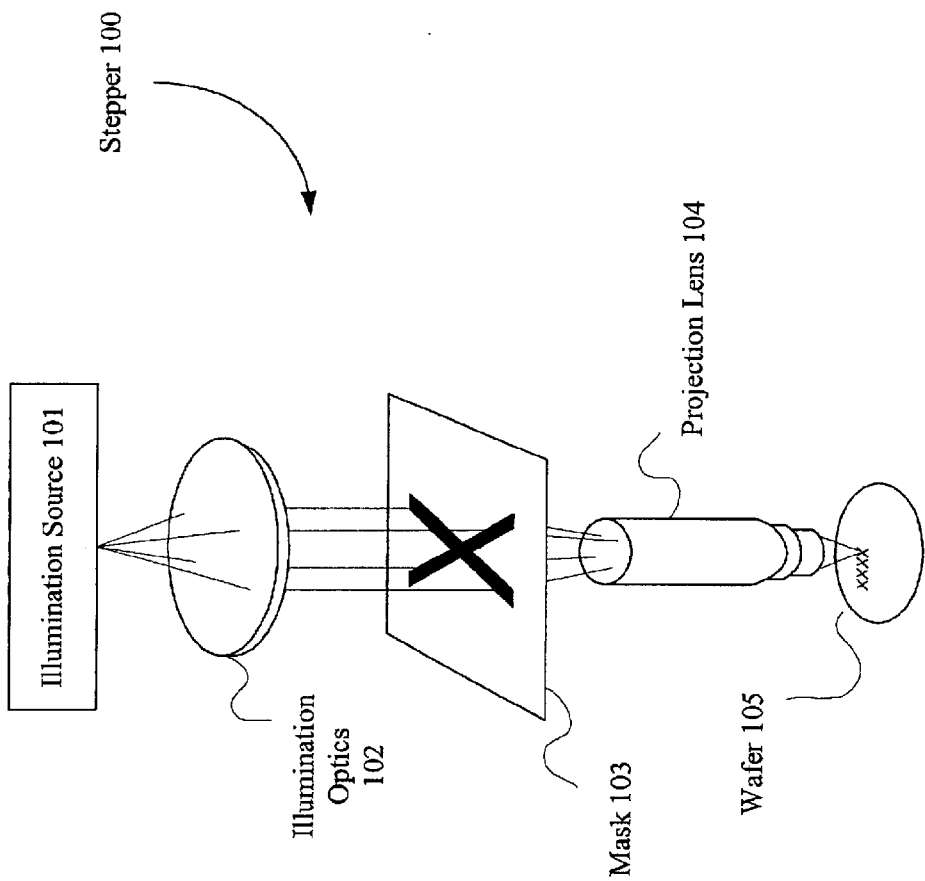
FIG. 1 illustrates a stepper including a refractive projection lens having multiple simple lens elements therein to minimize optical aberrations.
Figure 2A:
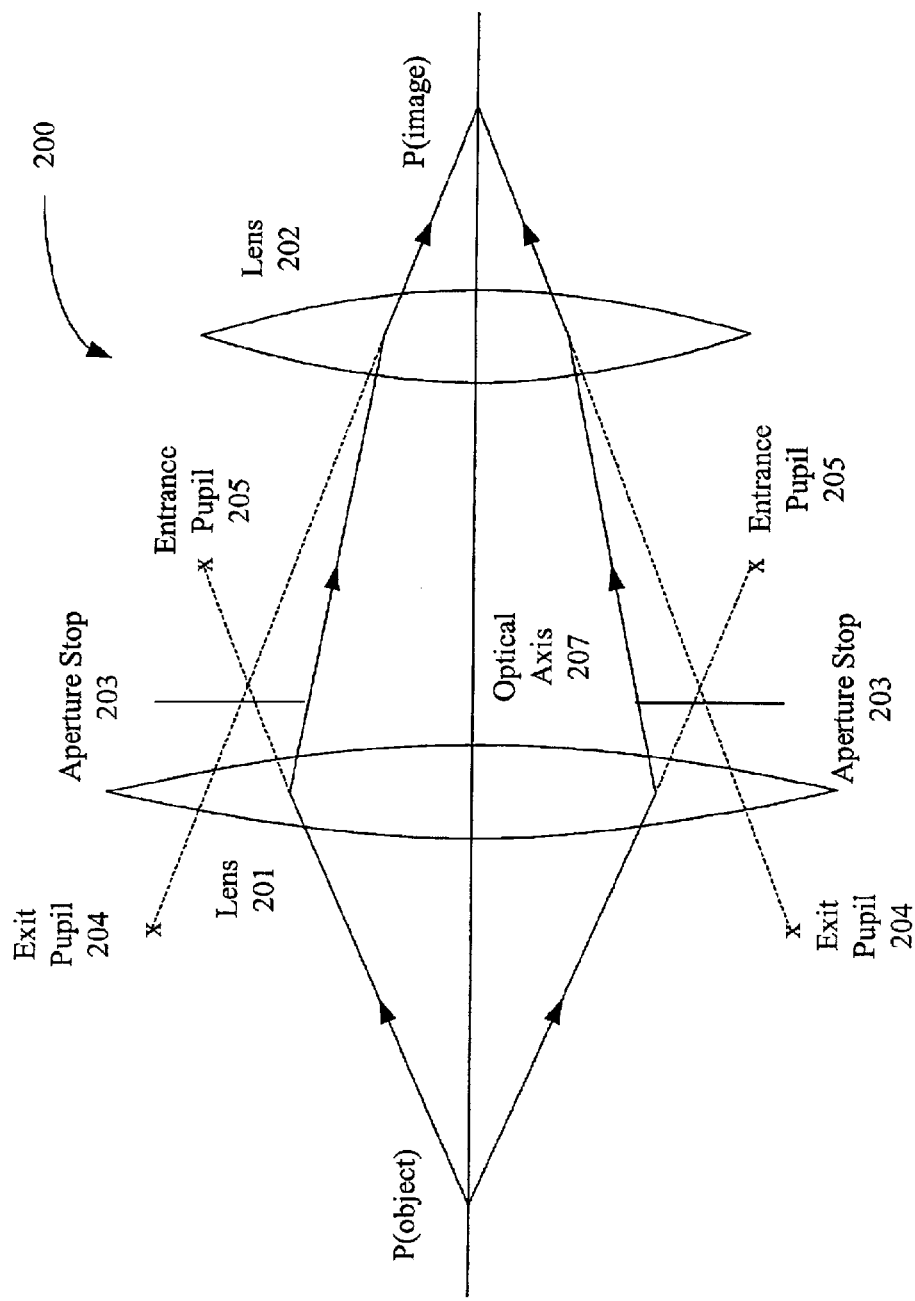
FIG. 2A illustrates a simplified optical system including two thin lens positioned along an optical axis.
Figure 3A:
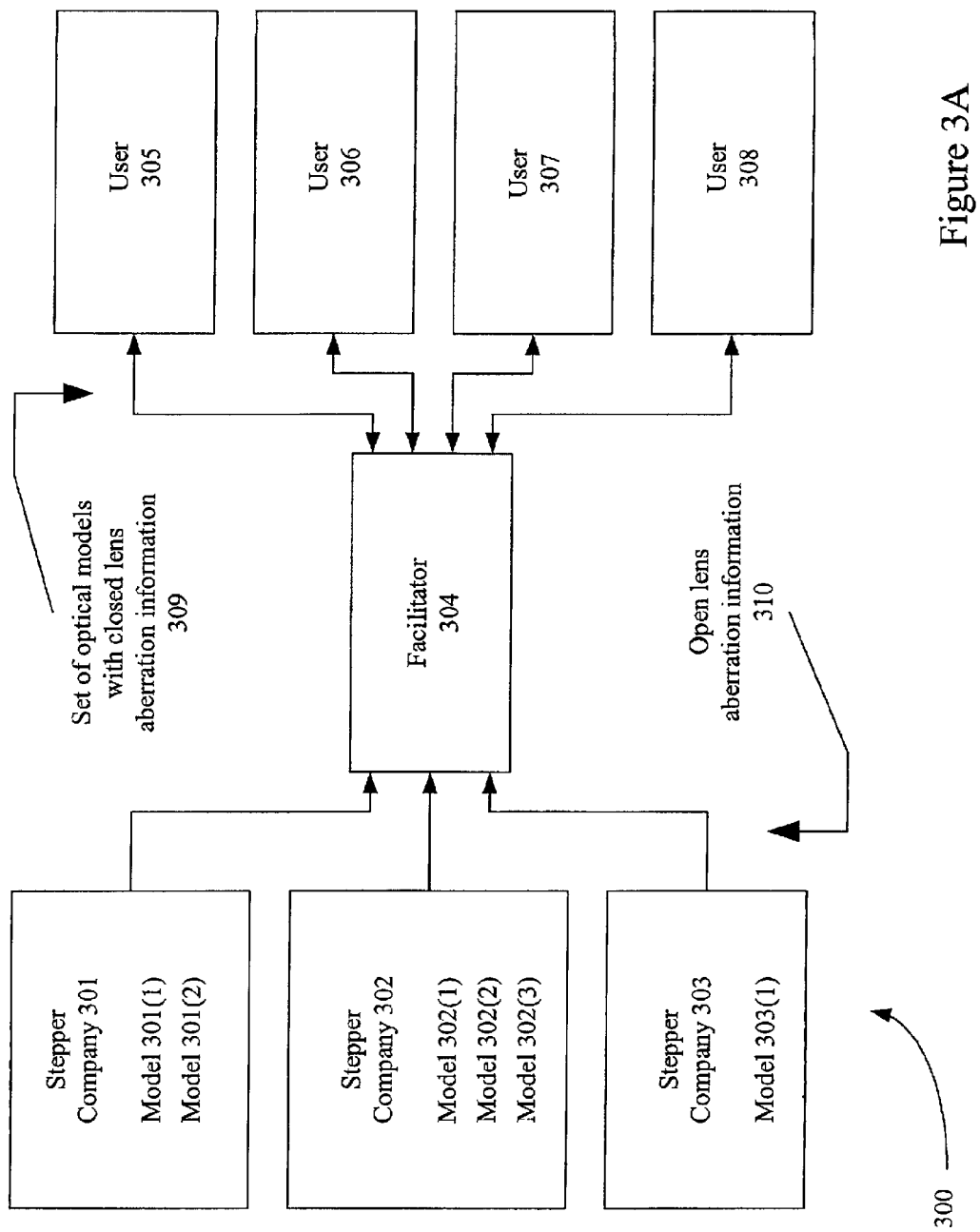
FIG. 3A illustrates one embodiment of a process flow in which users can request a facilitator to provide a set of optical models associated with a specific stepper. The optical models, which include closed lens aberration information, are based on open lens aberration information provided by the stepper companies.

FIG. 3A illustrates one embodiment of a process flow 300 in which a facilitator creates a set of optical models associated with specific steppers. Advantageously, the optical models include "closed" lens aberration information. As used herein, the term "closed" refers to lens aberration information that can be used by various tools but would be difficult to extract or view directly. Specifically, the lens aberration information including parameters such as Zernike polynomials, illumination non-uniformity parameters, and/or flare parameters (hereinafter "open" lens aberration information) associated with a specific stepper cannot be easily extracted from the optical models. Note that in one embodiment, the facilitator can receive encrypted files (including lens aberration information) from the stepper companies, wherein the tools/software provided by the facilitator can decrypt the files to allow generation of the appropriate optical models. In light of this decryption capability, the encrypted lens aberration information can still be considered "open" to the facilitator.

The open/closed lens aberration information can be considered analogous to source/object code. Specifically, the open lens aberration information, like source code in English-like language, can itself provide meaning to human viewers. In contrast, closed lens aberration information, like object code in machine language (i.e. a bit series of 1's and 0's), provides little if any meaning to human viewers.

Clearly, with the appropriate tools and/or resources, it might be possible to convert the closed lens aberration information into open lens aberration information. However, most users would have no motivation to expend the resources to obtain the open lens aberration information because the optical models including the closed lens aberration information provide the users with the full benefits of the open lens aberration information. Moreover, this conversion would probably be difficult enough to render the process both inaccurate and uneconomical, even for competitors of the stepper company.

In process flow 300, stepper companies 301, 302, and 303 can provide open lens aberration information regarding their respective stepper models (wherein each stepper model refers to a particular, physical stepper) to a facilitator 304. Specifically, stepper company 301 can provide information regarding its stepper models 301(1) and 301(2), stepper company 302 can provide information regarding its stepper models 302(1), 302(2), and 302(3), and stepper company 303 can provide information regarding its stepper model 303(1).

The volume of this open lens aberration information can be significant. As described above, a pattern can be transferred to a portion of a wafer in a single exposure. Therefore, for accurate results, a simulation of the stepper process must take into account potentially different aberrations associated with exposure through different parts of the lens. Specifically, some aberrations can be consistent across an image field while others are inconsistent. In fact, across the image field, the effect of each type of aberration can vary significantly. Thus, the lens aberration for a certain location in the image field can generate a unique wavefront, which can be described by a unique set of coefficients. In other words, these coefficients are image or object point dependent. Because an image field can include thousands of such image points, called sub-fields (described in further detail below), the amount of lens aberration information for the image field can be represented using approximately 36 coefficients per location.

Additionally, the lens aberrations can also vary depending on the setting of the lens. For example, using a different numerical aperture (NA), partial coherence ($\sigma$), and/or illumination conditions (e.g. off-axis, quadrapole, etc.) can significantly change the lens aberration for an image point. Therefore, the amount of data associated with each image field can be multiplied by the number of potential (or typical) numerical apertures and/or partial coherence factors.

Figure 3B:
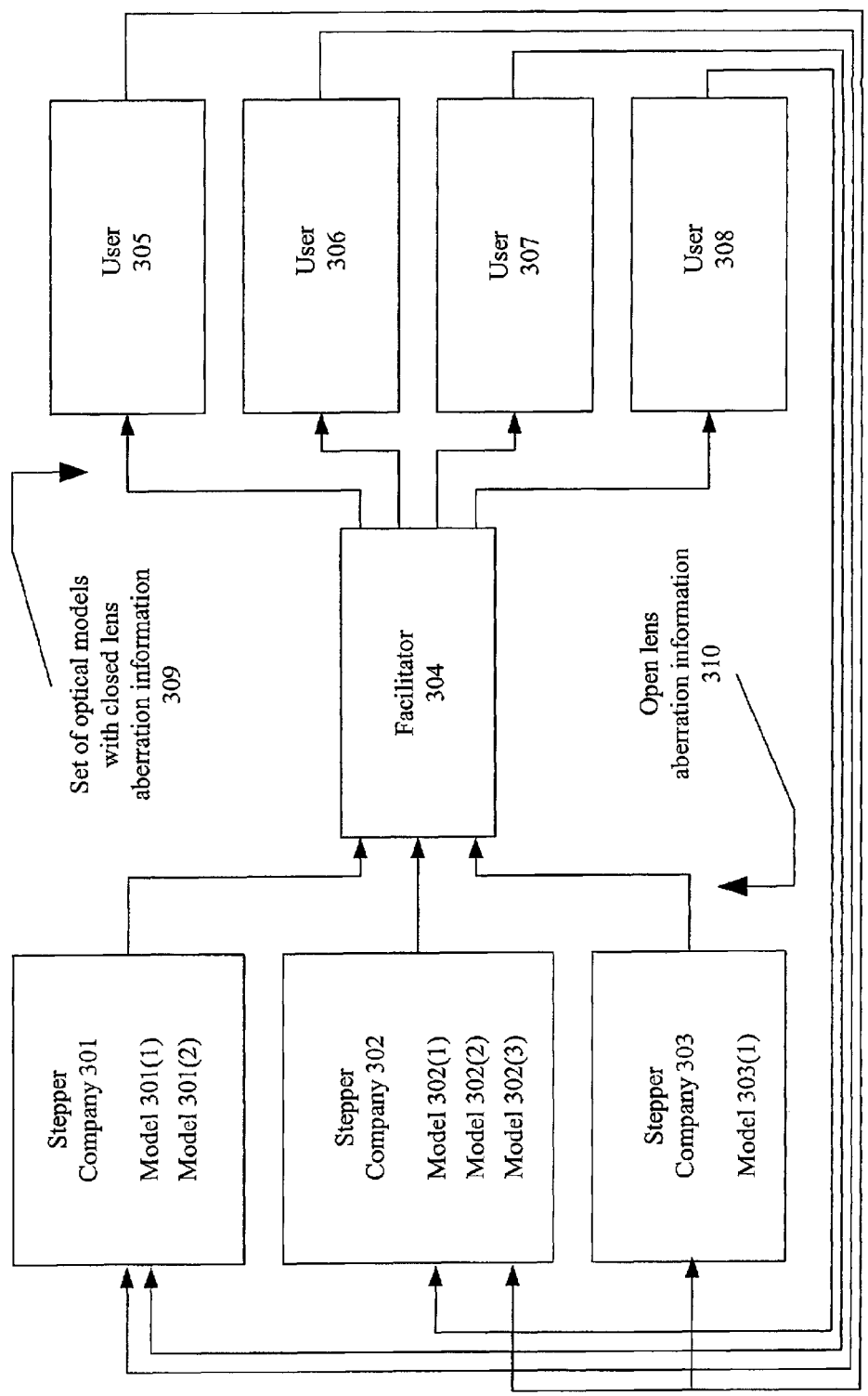
FIG. 3B illustrates another embodiment of a process flow, wherein the requests from the users are provided directly to the stepper companies, but then are forwarded to the facilitator to generate the appropriate optical models. The facilitator can forward the optical models to the users.
Figure 3C:
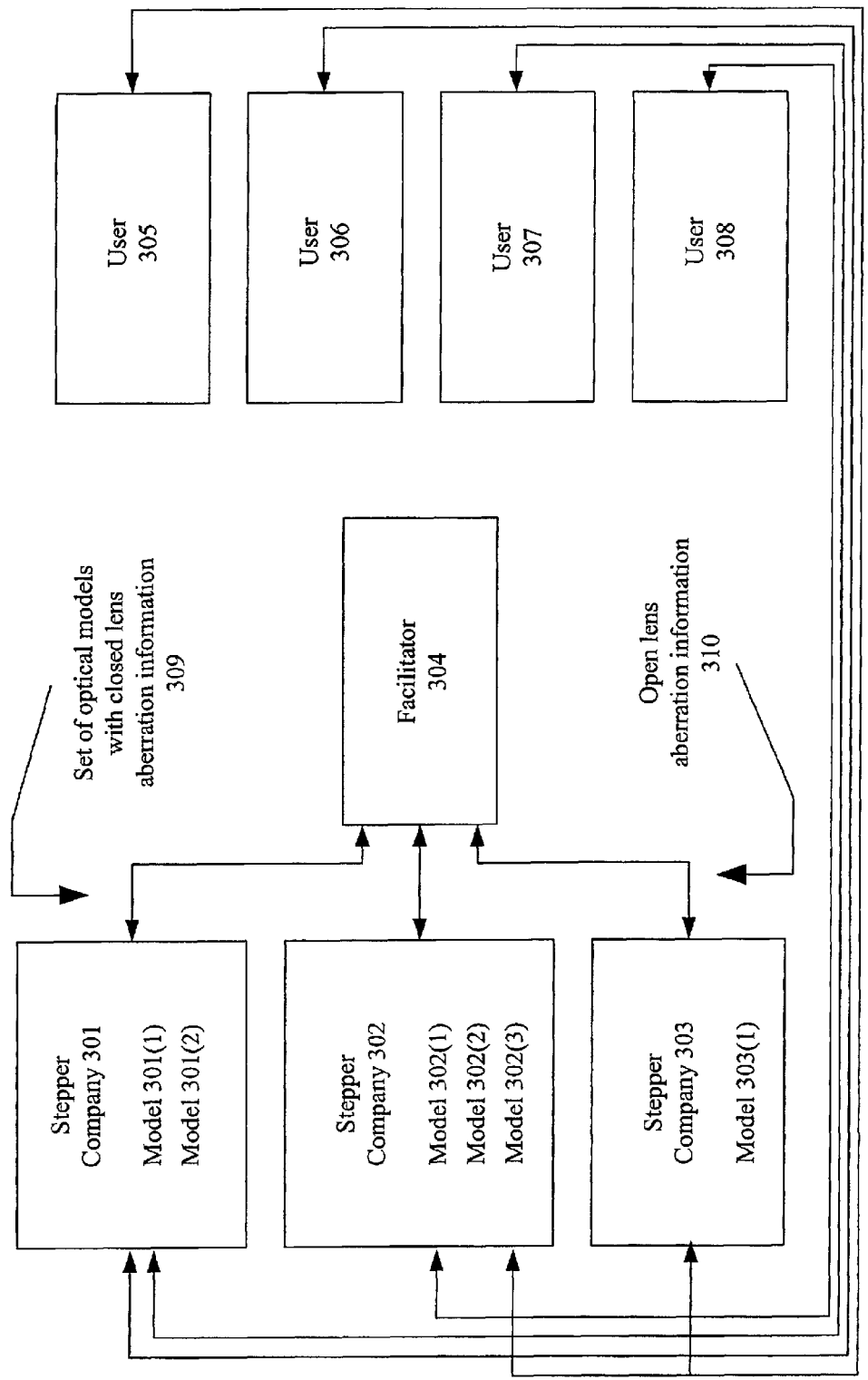
FIG. 3C illustrates yet another embodiment of a process flow, wherein the stepper companies forward requests from the users to the facilitator, which in turn generates the appropriate optical models and provides those models to the stepper companies. The stepper companies then forward the optical models to the users.
Figure 3E:
FIG. 3E illustrates an exemplary image field including a plurality of sub-fields, wherein some sub-fields are the same shape and size and other sub-fields are different shapes and sizes.
Figure 3D:
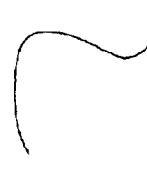
FIG. 3D illustrates an exemplary image field including a plurality of sub-fields having the same shape and size.

In one embodiment shown in FIG. 3D, an image field 330 can include a plurality of sub-fields 331 having the same shape and size. (Note that the sub-fields described herein can be any shape including, but not limited to, rectangular, square, triangular, and polygonal.) In another embodiment shown in FIG. 3E, an image field 340 can include a plurality of sub-fields 341, wherein some sub-fields are the same shape and size and other sub-fields are different shapes and sizes. In either embodiment, optical models can be generated for each sub-field 331/341. Note that dividing an image field into sub-fields can reflect locations where phase is rapidly changing, i.e. the gradient of the phase. In one embodiment, the optical models for the sub-fields comprising an image field can be compared, wherein if the optical models are within a certain range of variance, then a single optical model for the image field can approximate the optical models for the sub-fields comprising the image field.

Referring back to FIG. 3A, facilitator 304 can input open lens aberration information 310 into one or more tools to generate a set of optical models 309 including closed aberration information. Because users cannot easily extract open lens aberration information 310 from the set of optical models 309, stepper companies 301–303 can restrict user access to open aberration information 310 while allowing users to fully benefit from the use of this information via the set of optical models 309.

In one embodiment, facilitator 304 only represents the tools that can generate the set of optical models 309. In this embodiment, the tools can be located/used at the facility of stepper companies 301–303 and/or users 305–308. If the tools are located/used at the users' facilities, then stepper companies 301–303 can encrypt the open lens aberration information and the tools can include the appropriate decryption capability to generate the set of optical models for users 305–308.

In one embodiment, optical models 309 can be provided to a plurality of users on a request basis. For example, user 305 could request optical models for stepper models 302(3) and 303(1) to make a buying decision. Users 306 and 307 could request optical models for stepper models already in their production lines, e.g. stepper models 301(2) and 301 (2), to evaluate particular layouts. Finally, user 308 could request optical models for 302(1) and 302(2), once again for steppers in their production line, to determine which stepper can provide the best resolution for a new process. Because optical models 309 are based on open lens aberration information 310, these models are significantly more accurate than optical models without lens aberration information.

In providing more accurate optical models, process 300 allows the user to make better-informed decisions regarding stepper use/purchases while maintaining the constraints imposed by the stepper companies. Moreover, process 300 can dramatically reduce the time associated with making these decisions. Specifically, as feature sizes decrease and the lens aberration effect correspondingly increases, process 300 ensures that users can quickly take advantage of the set of optical models 309 generated by facilitator 304, irrespective of the technical sophistication of the user.

Facilitator 304 can provide the set of optical models 309 to users 305–308 in various formats using various media. Typically, the tools used to generate the set of optical models 309 are under the facilitator's control. In this case, the facilitator can send the set of optical models 309 to one or more users via the Internet, on CD-ROM, or on any other type of storage medium. The facilitator could also encrypt the set of optical models 309 and send this encrypted information to the user using any one of the above-mentioned media. In this case, the tools at the receiving end could include decryption capability. Note that stepper companies 301–303 can provide open lens aberration 310 to facilitator 304 using the above-described media. However, in light of the confidential nature of open lens aberration information 310, encryption can advantageously ensure an additional level of security.

In another embodiment, the requests from users 305–308 could be provided directly to stepper companies 301–303, as indicated in FIG. 3B. In this process flow 311, stepper companies 301–303 can forward these requests to facilitator 304, which in turn can generate the above-described set of optical models 309. In one embodiment, stepper companies 301–303 can explicitly indicate the role of facilitator 304 in generating optical models 309 and forwarding these models to users 305–308. In another process flow 312 shown in FIG. 3C, stepper companies 301–303 can once again forward user requests to facilitator 304, which in turn can generate the above-described set of optical models 309. However, in this case, the role of facilitator 304 in generating optical models 309 can be completely transparent to users 305–308. Specifically, facilitator 304 forwards optical models 309 to stepper companies 301–303, which in turn forward those models to users 305–308. In yet another embodiment, stepper companies 301–303 initiate requests for the optical models and, once generated by facilitator 304, forward those optical models to users 305–308. Note that users 305–308 described in reference to FIGS. 3A–3C can include, for example, stepper customers, wafer/mask customers, mask shops, and/or design companies.

In process flows 300, 311, and 312, facilitator 304 can request payment based on any number of combinations of stepper parameters, e.g. stepper model, numerical aperture, partial coherence factor, and/or illumination conditions. Additionally, the stepper company may also request payment on behalf of the facilitator.

In accordance with one embodiment, providing an accurate simulation of a complete stepper process can include both optical and, optionally, calibrated information. The above-described lens aberration information is one example of optical information. The calibrated information can include photoresist, edge effects, or other chemical/process information derived experimentally. Calibration tools can use the closed lens aberration information included in the set of optical models, thereby improving the accuracy of the calibrated models generated by the calibration tools.

Figure 4:
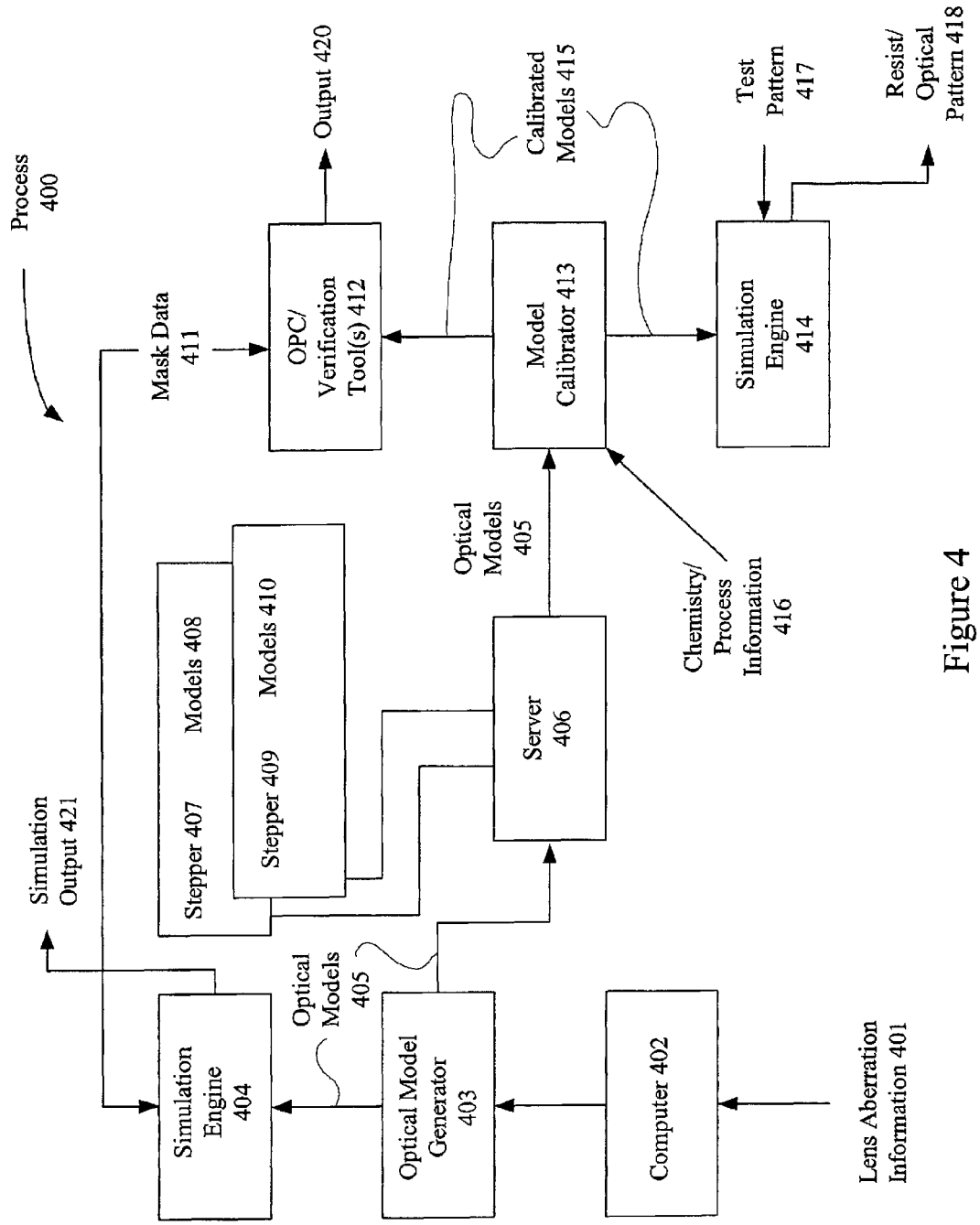
FIG. 4 illustrates a model-generating process allowing the input of both optical and calibrated information.

FIG. 4 illustrates a model-generating process 400 allowing the input of both optical and calibrated information. In process 400, a facilitator can input lens aberration information 401 into a computer 402, wherein lens aberration information 401 is only valid for a particular stepper. The facilitator can use an optical model generator 403, which is placed in operative relation to computer 402, to generate a set of optical models 405 based on lens aberration information 401. Optical model generator 403 can be implemented using the ModelGen™ software, a tool licensed by Numerical Technologies, Inc., as well as other tools available from Avant!, Mentor Graphics, and other companies. Note that a simulation engine 404 can use optical models 405 with mask data 411 to generate an uncalibrated simulation output 421 of that mask data. In one embodiment, mask data 411 can include a layout of a mask. In another embodiment, mask data 411 can include actual image data generated by a mask inspection tool.

A wafer fabrication facility (hereinafter fab) typically includes a plurality of steppers. Optical models 405 could relate to one or a set of specific steppers in the fab. For example, the fab could have a model 408 of a stepper 407 and a model 410 of a stepper 409. A server 406 could store optical models 405, which in this case could relate to stepper 407 (model 408) and/or stepper 409 (model 410). Optical models 405 can then be provided to a model calibrator 413 to generate calibrated models 415. In one embodiment, chemistry and/or other process information 416, including critical dimension measurements from an exposed wafer, could also be provided to model calibrator 413 to further increase the accuracy of calibrated models 415. Model calibrator 413 can be implemented using ModelCal™, a tool licensed by Numerical Technologies, Inc., as well as other tools from Avant! and Mentor Graphics.

Calibrated models 415 can be provided to a simulation engine 414, along with a test pattern 417, to generate a simulation of that test pattern. In a typical embodiment, this simulation could include an optical and/or resist pattern 418. Note that simulation engines 414 and 404 can be implemented with any simulation engine products, including ICWorkbench™ and/or Virtual Stepper® System provided by Numerical Technologies, Inc., as well as other tools from Avant! and Mentor Graphics.

Calibrated models 415 can also be provided to optical proximity correction (OPC) and/or verification tools 412. In the case of OPC, tool 412 can use mask data 411 to optimize or correct OPC in light of the closed lens aberration information provided in calibrated models 415. In the case of verification, tool 412 could provide the user with some alternative features to optimize the data. OPC/verification tool(s) to generate output 420 can be implemented using SiVL™ or Photolynx™, both tools licensed by Numerical Technologies, Inc., as well as other compatible tools, e.g. from Avant!, Mentor Graphics, etc. Note that calibrated models 415 can be provided to other resolution enhancement technique (RET) tools for further processing. In one embodiment, this RET tool could include a simulation engine provided by a first entity used in conjunction with software (OPC, verification, etc.) provided by a second entity.

Figure 5:
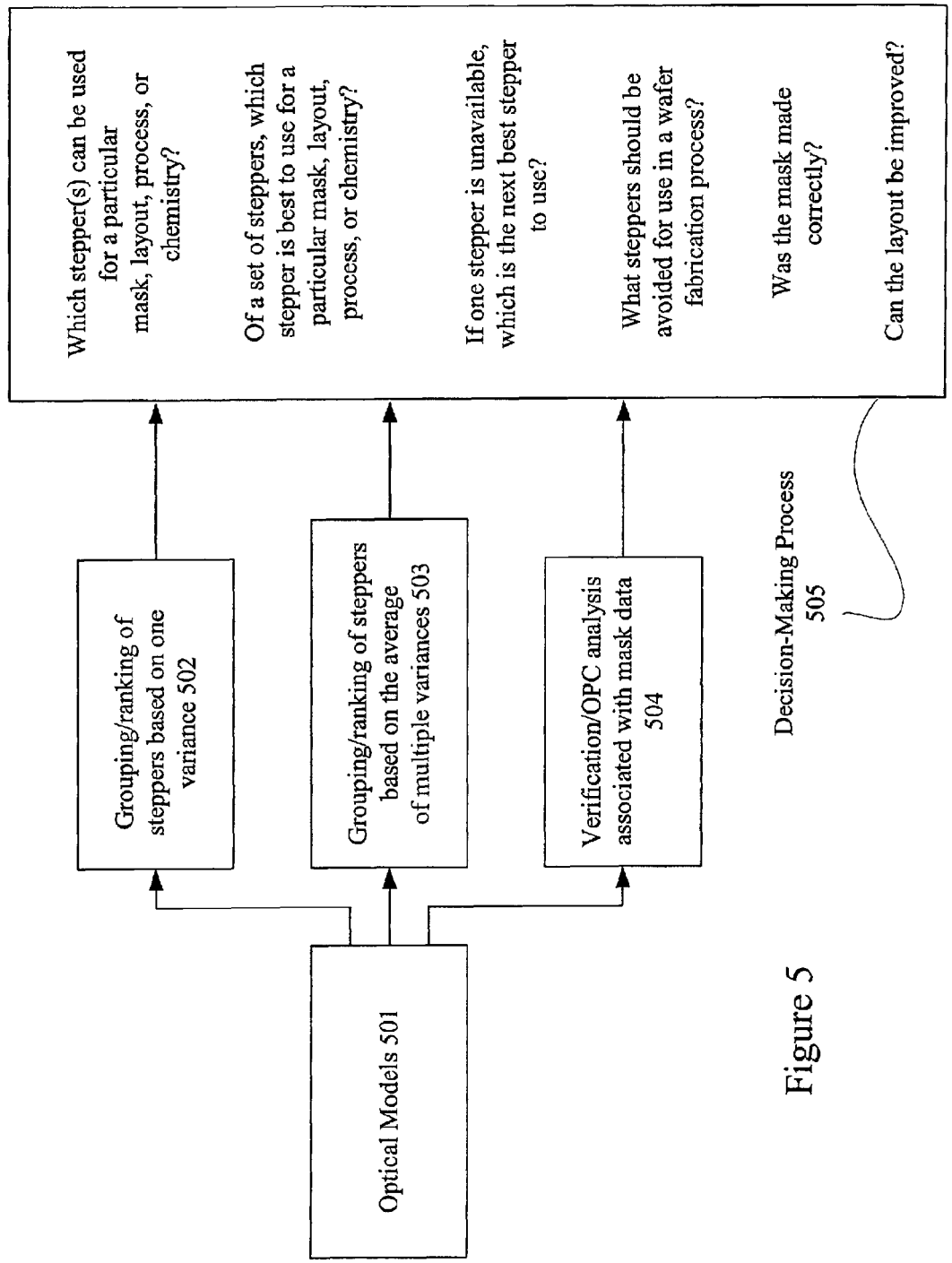
FIG. 5 illustrates a decision-making process that is facilitated by using optical models.

Providing a user with closed lens aberration information can significantly improve that user's decision-making capability. Note that a user could be a fab, a mask shop, an end-user receiving mask/wafers from the mask shop/fab, or a design company. FIG. 5 illustrates a decision-making process 505 that is facilitated by using optical models 501. Specifically, by using optical models 501, the steppers can be grouped and/or ranked based on one variance (e.g. CD variance)(502) or on the average (or weighted average) of a plurality of variances (503). For example, a CD specification could be provided for each given level (e.g. +/− 10 nm for one level and +/− 20 nm for another level). Additionally, verification and/or OPC analysis associated with mask data can also be provided (504).

Based on this information, many decisions can now be made easily by the user or by an automated system operating under direction of the output. For example, a user can determine which stepper(s) can be used for a particular mask, layout, process, and/or chemistry. The decision to select a stepper can be based on a ranking of suitable steppers (e.g. the steppers that can reproduce a mask pattern within a predetermined amount of permitted critical parameter variance), the availability of the suitable steppers (e.g. the first available or available within a predetermined period of time), or a combination of ranking and availability. For example, a user could also determine a ranking of various steppers, wherein if the "best" stepper (e.g. the stepper that can reproduce a mask pattern with the least amount of critical parameter variance) is unavailable at a particular stage in the wafer fabrication process, then the next best available stepper can be used.

Figure 6:
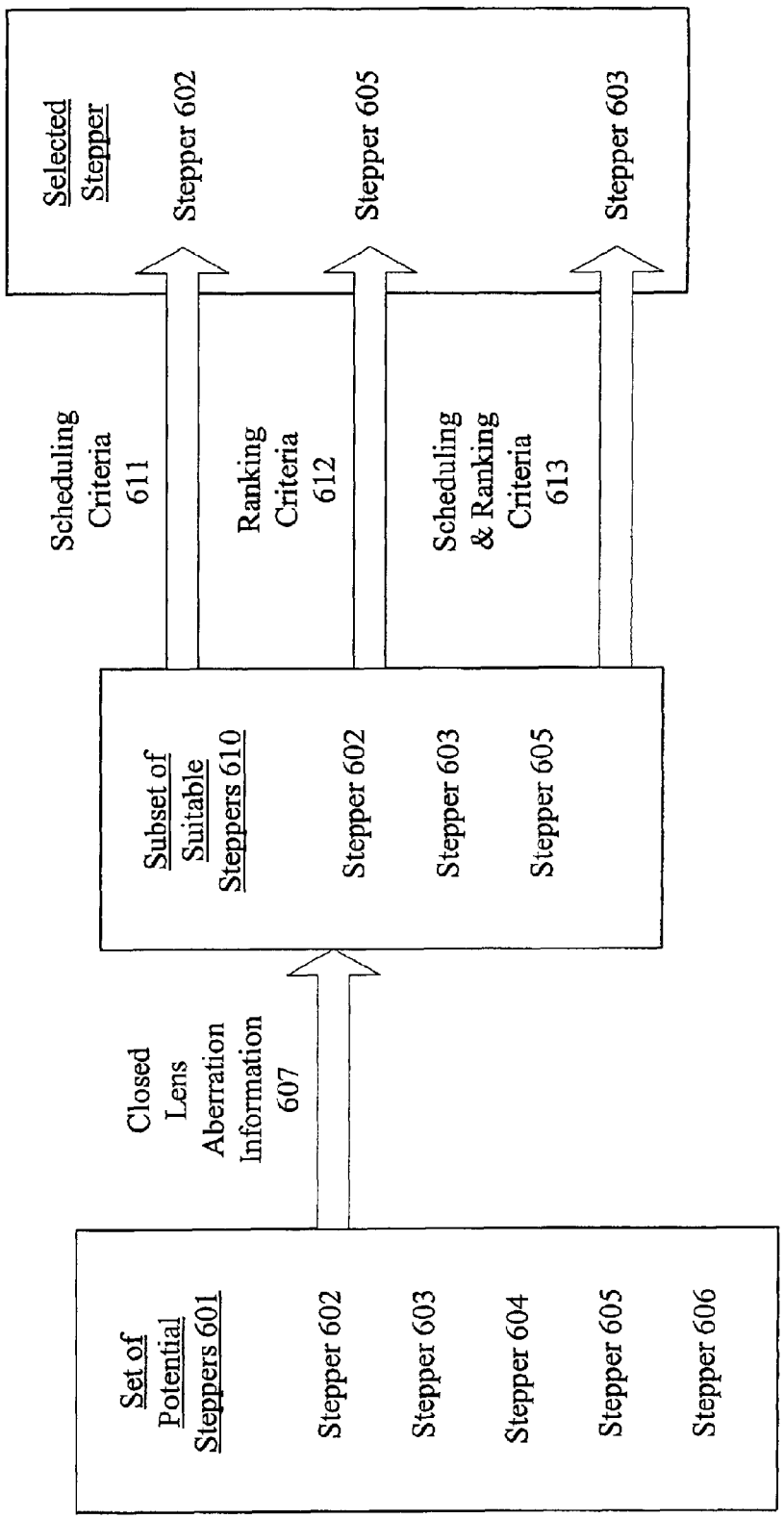
FIG. 6 illustrates an exemplary process wherein closed lens aberration information as well as scheduling and/or ranking criteria can be used to select a suitable stepper.

FIG. 6 illustrates an exemplary process wherein scheduling and/or ranking criteria can be used to select a suitable stepper. Specifically, in FIG. 6, a set of potential steppers 601 can include steppers 602–606. By using closed lens aberration information 607 for each of steppers 602–606, a subset 610 of the set of potential steppers can be determined. In one embodiment, the steppers in subset 610, in this case steppers 602, 603, and 605, are suitable for reproducing a pattern of a particular mask within a predetermined amount of permitted critical parameter variance. In another embodiment, determining suitable steppers can be done using an average (or weighted average) of multiple variances. In yet another embodiment, verification and/or OPC analysis associated with mask data can determine the suitable steppers.

By using predetermined criteria, one of the suitable steppers in subset 610 can be selected for use. For example, if scheduling criteria 611 is used, then stepper 602 could be selected because it is the first available stepper of the suitable steppers in subset 610. In another example, if ranking criteria (e.g. based on critical parameter variance) 612 is used, then stepper 605 could be selected because it has the least critical parameter variance of suitable steppers in subset 610. In yet another example, if scheduling and ranking criteria (e.g. based on scheduling and critical parameter variance) 613 is used, then stepper 603 could be selected because, within a predetermined period of time, it is available and has the least critical parameter variance of those steppers available.

The ranking of the steppers could be based on lowest CD variance and/or defined tolerances (which could include edge length, feature width, separation, etc.). Note that the ranking could be layout dependent, i.e. the ranking of a set of steppers can vary based on the layer or type of pattern (polysilicon, contacts, memory pattern, logic pattern, etc.). In one embodiment, the ranking can be tied to a simulation output (see FIG. 4). Additionally, the user can also determine what stepper(s) should be avoided for use in wafer fabrication. Finally, before beginning the expensive process of writing wafers, the user can determine whether a mask was made properly (OPC, etc.) or whether a layout for a mask can be improved based on the optical models. Specifically, by using certain tools (referring to OPC/verification tool(s) 412 in FIG. 4), the mask design after RET or a manufactured mask, and the lens aberration information for selected stepper, the resulting printed image can be checked that it is within a predetermined tolerance of the layout of the image. In a similar manner, OPC features, such as assist features, hammerheads, etc., can be checked for size and position.

Applications/uses of the invention can include, but are not limited to:

scheduling of stepper resources within a wafer fabrication facility;

performing one or more resolution enhancement techniques (RETs) targeted for a particular stepper or set of steppers;

testing of stepper performance over its lifetime;

providing a client-server over a network for providing closed lens aberration data, including the Internet and an Intranet;

running a server at the customer's location using a network to the server, wherein the server manages the customer's steppers using closed lens aberration information for those steppers;

determining how to divide the sub-fields;

allowing third party tools to access aberration simulated data;

providing acceptance criteria for stepper purchase;

generating/extracting design rules based on stepper conditions;

providing yield prediction and/or process control;

applying various combinations of RETs;

allowing steppers to not only be prioritized, but also grouped based on similarity found through simulation;

using a simulation tool with a $3^{rd}$ party's test pattern and providing the simulated output to a $3^{rd}$ party's model generator (in one embodiment, the model generator can request measurements at designated locations used for building the model); and differentiating stepper capabilities, as new controls to optical parameters are devised.

According to some embodiments, the model files can be separated into two or more components that are separately provided. For example, the end user might receive one component of the model from a facilitator and a second component from the stepper company (or another facilitator). In such an embodiment, the component from the stepper company (or the other facilitator) could include the lens aberration information in closed form.

Although illustrative embodiments of the invention have been described in detail herein with reference to the accompanying figures, it is to be understood that the invention is not limited to those precise embodiments. They are not intended to be exhaustive or to limit the invention to the precise forms disclosed. As such, many modifications and variations will be apparent to practitioners skilled in this art. For example, although Zernike polynomials are described herein as describing the types of lens aberrations, other representations of the aberration data could be used. In one embodiment, optimal coherence decomposition (OCD) can be used to quickly calculate the optical image. Note that the methods described herein can be applied to any lithographic process technology, including ultraviolet, deep ultraviolet (DUV), extreme ultraviolet (EUV), x-ray, and ebeam. Accordingly, it is intended that the scope of the invention be defined by the following Claims and their equivalents.

What is claimed is:

1. A process to assist a second party in making a decision regarding the use of a stepper, the process including:

a first party receiving lens aberration information for the stepper;

the first party generating optical models using the lens aberration information; and the first party allowing the second party access to the optical models, but not the lens aberration information, wherein the second party in performing a function with the optical models provides an output that facilitates the decision.

2. The process of claim 1, wherein performing the function includes performing a simulation with particular mask data.

3. The process of claim 1, wherein performing the function includes providing a calibrated model.

4. The process of claim 3, wherein providing a calibrated model includes inputting at least one of chemistry and process information.

5. The process of claim 3, wherein performing the function further includes performing a simulation with a test pattern.

6. The process of claim 3, wherein performing the function further includes performing a verification with particular mask data.

7. The process of claim 3, wherein performing the function further includes performing optical proximity correction checking with particular mask data.

8. The process of claim 1, wherein the lens aberration information is encrypted and generating optical models using the lens aberration information includes decrypting the lens aberration information.

9. The process of claim 1, wherein allowing the second party access to the optical models includes the second party using a server that stores the optical models.

10. The process of claim 9, wherein the server is controlled by a third party, and allowing the second party access to the optical models includes the second party requesting access to the server.

11. The process of claim 1, wherein allowing the second party access to the optical models includes providing a server controlled by the first party.

12. The process of claim 1, wherein allowing the second party access to the optical models includes providing a client-server over a network.

13. A method of evaluating a stepper process, wherein lens aberration affects the stepper process, the method comprising:

receiving, from a facilitator responding to a request, a set of optical models including lens aberration information, wherein the lens aberration information is difficult to extract from the optical models; and using the set of optical models to make a decision regarding the stepper process.

14. The method of claim 13, wherein the decision includes determining from a plurality of steppers a subset of the plurality of steppers suitable for reproducing a mask pattern within a predetermined amount of permitted critical parameter variance.

15. The method of claim 13, wherein the decision includes determining from a plurality of steppers a subset of the plurality of steppers suitable for reproducing a layout within a predetermined amount of permitted critical parameter variance.

16. The method of claim 13, wherein the decision includes determining from a plurality of steppers a subset of the plurality of steppers suitable for reproducing mask data within a predetermined amount of permitted critical parameter variance in combination with at least one of a process and a chemistry.

17. The method of claim 13, wherein the decision includes ranking a plurality of steppers based on mask data, the ranking indicating a preferred selection of steppers for a particular mask data.

18. The method of claim 13, wherein the decision includes determining from a plurality of steppers a subset of the plurality of steppers that should be avoided for use with at least one of a mask, a layout, a process, and a chemistry.

19. The method of claim 13, wherein the decision includes determining whether a mask is correctly made.

20. The method of claim 19, wherein determining includes analyzing optical proximity correction (OPC) on the mask.

21. The method of claim 13, wherein the facilitator receives compensation for the set of optical models.

22. The method of claim 21, wherein a stepper company directly compensates the facilitator for the set of optical models.

23. The method of claim 21, wherein a stepper company indirectly compensates the facilitator for the set of optical models.

24. The method of claim 21, wherein a user compensates the facilitator for the set of optical models.

25. The method of claim 13, wherein the facilitator receives Zernike polynomials from at least one stepper company, wherein the Zernike polynomials are used for generating the set of optical models.

26. The method of claim 13, wherein the request comes from a user.

27. The method of claim 26, wherein the user includes one of a mask customer, a wafer customer, mask shop, and a design company.

28. The method of claim 13, wherein the request comes from a stepper company.

29. A method of a facilitator providing lens aberration information regarding a stepper to a user, the method comprising:

receiving lens aberration information regarding the stepper;

generating optical models using the lens aberration information, wherein the lens aberration information is difficult to extract from the optical models; and providing the optical models to the user.

30. The method of claim 29, further including receiving a request from the user for the optical models.

31. The method of claim 30, wherein the user includes one of a mask customer, a wafer customer, a mask shop, and a design company.

32. The method of claim 29, further including receiving a request from a stepper company for the optical models.

33. The method of claim 32, wherein the stepper company forwards the optical models to the user.

34. The method of claim 29, further including the facilitator billing based on each set of optical models.

35. The method of claim 29, wherein the optical models include numerical aperture information and partial coherence factors.

36. The method of claim 29, further including simulating mask data using the optical models.

37. The method of claim 29, further including calibrating the optical models.

38. The method of claim 37, wherein calibrating includes at least one of chemistry and process information.

39. The method of claim 37, further including simulating a test pattern using calibrated optical models.

40. The method of claim 37, further including verifying mask accuracy using calibrated optical models.

41. The method of claim 37, further including analyzing optical proximity correction (OPC) on a mask using calibrated optical models.

42. The method of claim 29, wherein the lens aberration information is encrypted and generating optical models includes decrypting the lens aberration information.

43. A mask used with a stepper, the stepper being selected based on a decision made by a user, the user following the steps of:

receiving, from a facilitator responding to a request, a set of optical models including lens aberration information, wherein the lens aberration information is difficult to extract from the optical models; and using the set of optical models to make the decision.

44. An integrated circuit produced using a stepper, the stepper being selected based on a decision made by a user, the user following the steps of:

receiving, from a facilitator responding to a request, a set of optical models including lens aberration information, wherein the lens aberration information is difficult to extract from the optical models; and using the set of optical models to make the decision.

* * * * *